US006756929B1

(12) United States Patent
Ali

(10) Patent No.: US 6,756,929 B1
(45) Date of Patent: Jun. 29, 2004

(54) METHODS AND STRUCTURES FOR INTERLEAVABLY PROCESSING DATA AND ERROR SIGNALS IN PIPELINED ANALOG-TO-DIGITAL CONVERTER SYSTEMS

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/402,277

(22) Filed: Mar. 27, 2003

(51) Int. Cl.[7] .......................... H03M 1/12; H03M 1/38
(52) U.S. Cl. ..................................... 341/161; 341/172
(58) Field of Search ............................. 341/161, 118, 341/120, 172, 162; 327/157, 337, 354; 330/252

(56) References Cited

U.S. PATENT DOCUMENTS

| | | | | |
|---|---|---|---|---|
| 5,594,445 A | * | 1/1997 | Ginetti | 341/162 |
| 5,990,820 A | * | 11/1999 | Tan | 341/161 |
| 6,184,809 B1 | | 2/2001 | Yu | |
| 6,323,800 B1 | * | 11/2001 | Chiang | 341/161 |
| 6,337,651 B1 | * | 1/2002 | Chiang | 341/161 |
| 6,362,770 B1 | * | 3/2002 | Miller et al. | 341/172 |
| 6,501,400 B2 | | 12/2002 | Ali | |
| 6,563,445 B1 | * | 5/2003 | Sabouri | 341/120 |
| 6,686,864 B1 | * | 2/2004 | Moreland | 341/161 |

* cited by examiner

Primary Examiner—Patrick Wamsley
(74) Attorney, Agent, or Firm—Koppel, Jacobs, Patrick & Heybl

(57) ABSTRACT

Methods and structures are provided for interleavably processing data signals and error signals in alternating first and second operational phases of successive converter stages of pipelined analog-to-digital converter systems. In particular, converter stages are arranged to interleavably process data signals and error signals in alternating first and second operational phases as they convert input data signals to corresponding digital code. The interleaved methods and structures significantly reduce conversion errors caused by less-than-infinite gain A of converter stage amplifiers. Because this performance enhancement is realized primarily with existing pipelined structure, modification complexity and cost of conventional pipelined systems is substantially reduced. The advantages of the invention are also realized with minimal increase in power consumption and circuit space.

40 Claims, 9 Drawing Sheets

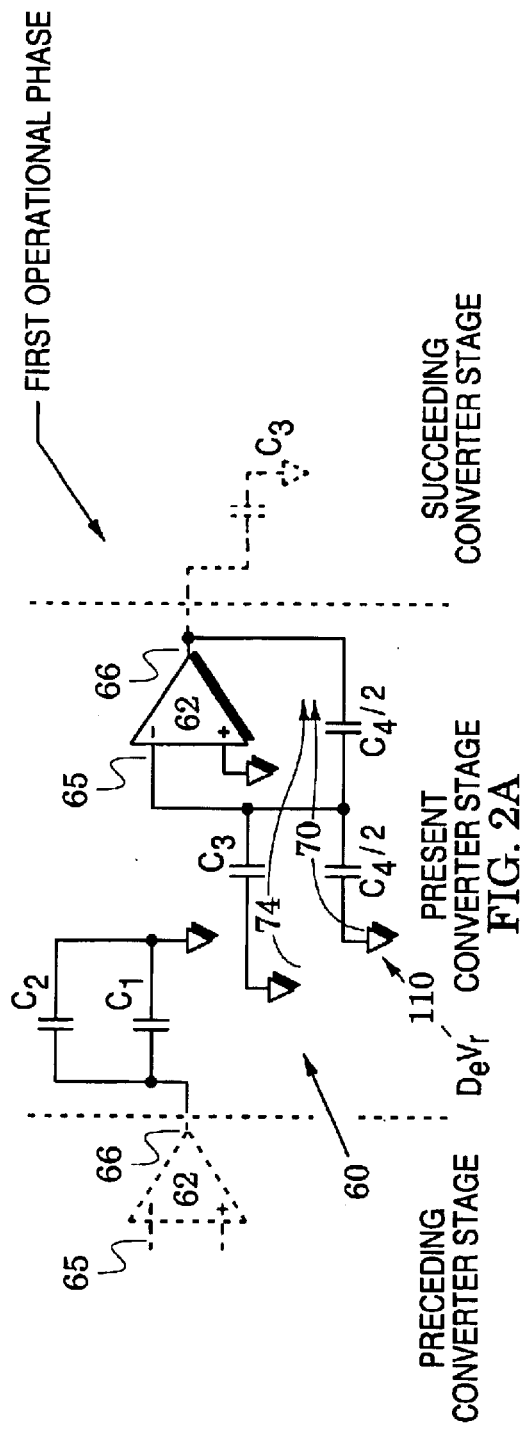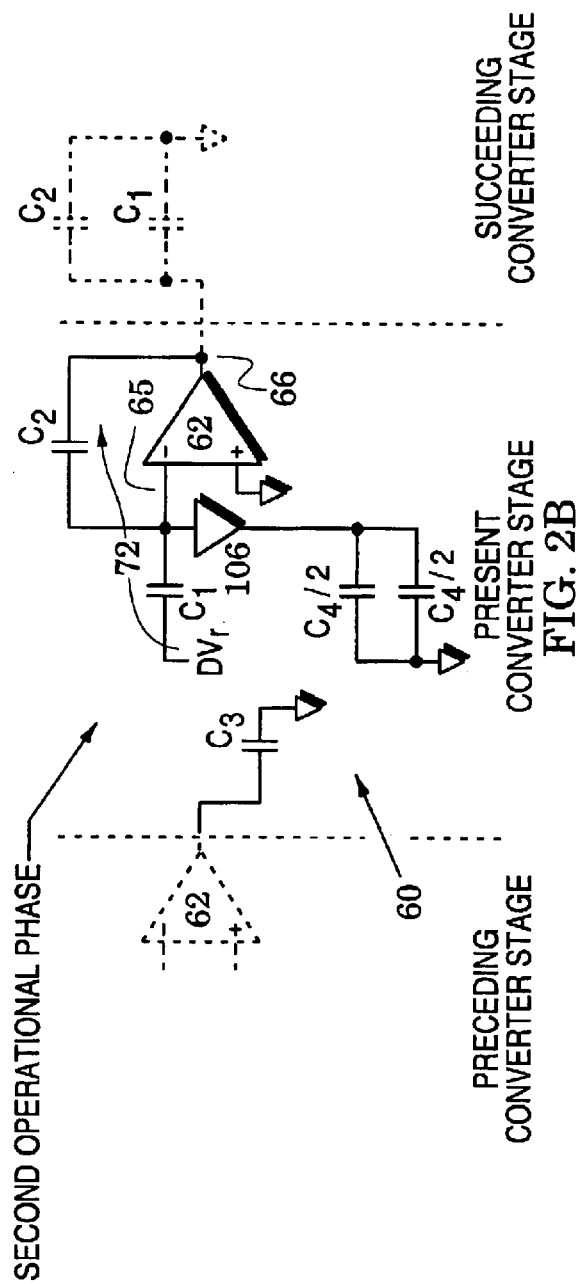
FIG. 2A
FIG. 2B

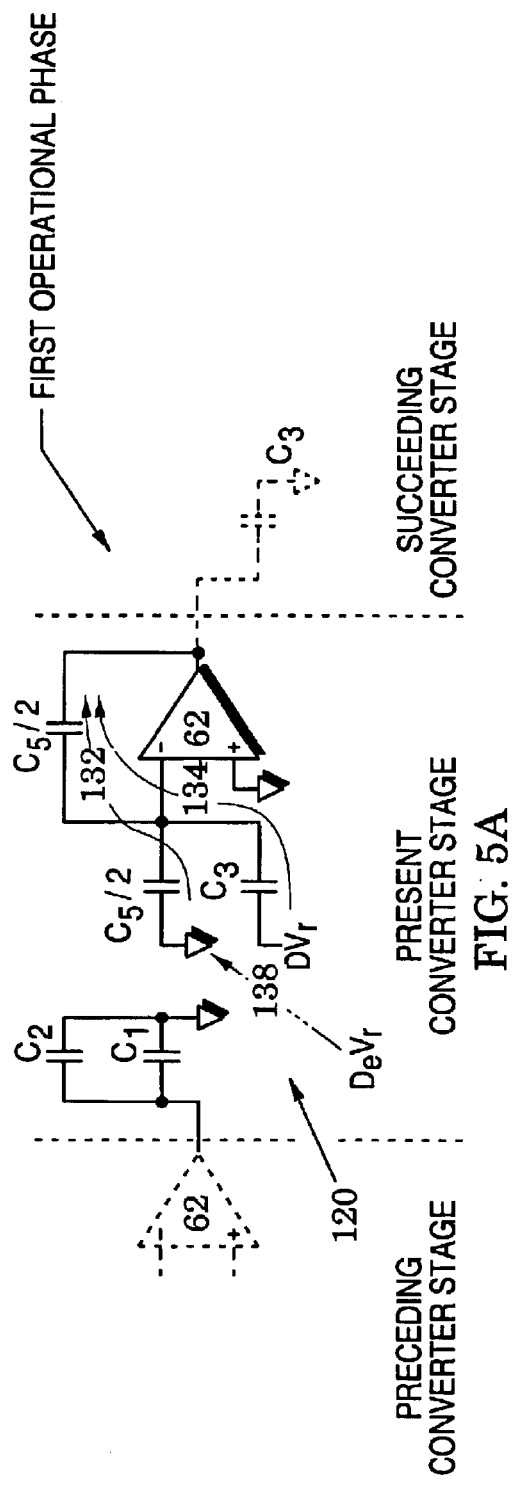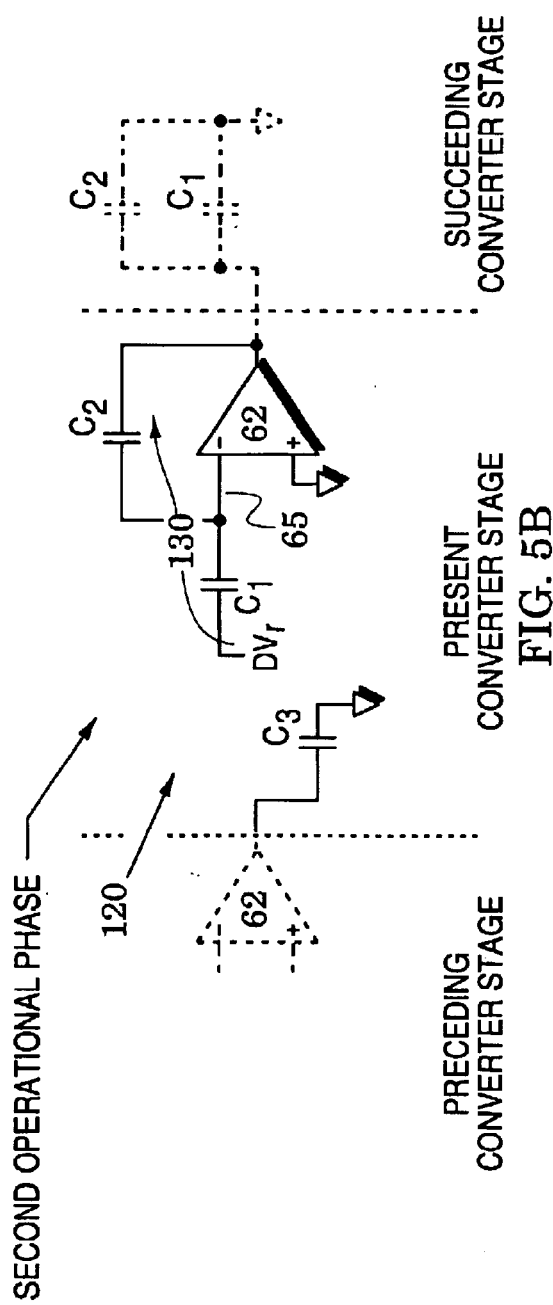
FIG. 5A
FIG. 5B

METHODS AND STRUCTURES FOR INTERLEAVABLY PROCESSING DATA AND ERROR SIGNALS IN PIPELINED ANALOG-TO-DIGITAL CONVERTER SYSTEMS

BACKGROUND OF THE INVENTION

1. Field of the Invention

The present invention relates generally to pipelined analog-to-digital converters.

2. Description of the Related Art

An impressive variety of modern electronic systems (e.g., scanners, camcorders, communication modems, medical image processors and high-definition television) require the signal conditioning provided by analog-to-digital converters (ADCs) which convert input data signals to digital codes with a resolution that corresponds to the number of bits in the digital code.

An especially useful ADC structure is exemplified in FIG. 1 which illustrates a pipelined ADC system 20 that includes a sampler 22 and N pipelined converter stages 24. The sampler provides samples of an input data signal $S_{in}$ and each pipelined converter stage converts a respective analog input data signal to that converter stage's predetermined number of digital bits and passes an amplified residue signal to a succeeding converter stage (the amplified residue signal is the respective analog input signal of the succeeding converter stage).

As the succeeding converter stage converts its received residue signal in a similar manner, the preceding converter stage is converting a succeeding analog input signal. All converter stages, therefore, are simultaneously converting input data signals to their respective digital bits with final converted words issuing at the same rate as the sampling rate of input data signals. By partitioning the conversion among a number of low resolution converter stages, the pipelined structure provides high resolution a high sampling speeds.

Broken lines 26 in FIG. 1 indicate that the ith converter stage, for example, comprises an $m_i$-bit ADC 30 which provides digital bits $D_i$ and also comprises an $m_i$-bit digital-to-analog converter (DAC) 32 that converts $m_i$ bits to an analog signal which is then subtracted in a summer 34 from this converter stage's respective analog input to form an analog residue $R_i$ that is amplified in a respective amplifier 36 with a respective gain $G_i$ and passed to a successive converter stage.

The N converter stages thus generate digital bits $D_1$, $D_2$–$D_N$ that correspond to each input data signal. Generally, one or more redundant bits are also generated and a control and correction logic 37 includes circuits (e.g., full adders) that use the bits of succeeding stages to digitally correct preceding-stage errors which result from various degrading effects. The control and correction logic also includes circuits (e.g., shift registers) that time-align the corresponding digital bits of the different converter stages to produce the final digital code $C_{dgtl}$.

A particularly useful structure for realizing the converter stage structure within the broken line 38 is a switched-capacitor multiplying digital-to-analog converter (MDAC) 40 which is indicated by the broken-line arrow 39. The MDAC 40 is shown in a 1.5 bit version which comprises a differential amplifier 42, equal-sized capacitors $C_1$ and $C_2$ and a plurality of switches. For clarity of illustration, the switches are not shown but in operation, the switches are placed in first and second states which configure the MDAC 40 (in states 40A and 40B) for first and second operational phases.

In the first operational phase that corresponds to state 40A, both capacitors are coupled to their converter stage's input voltage $v_{in}$. Because the amplifier 42 has high gain, its inverting and noninverting inputs are at substantially the same potential, i.e., they are both at ground potential. Accordingly, the capacitors take on an electrical charge that corresponds to the input voltage $v_{in}$.

In the second operational phase that corresponds to state 40A, a decision signal $DV_r$ is applied (by the $m_i$-bit ADC 30) to one plate of the capacitor $C_1$ which transfers its electrical charge to the capacitor $C_2$ as indicated by charge-transfer arrow 44. The voltage $V_r$ represents plus and minus limits of the input range of the converter stage. D is set by the decision of the corresponding ADC converter stage concerning its analog input signal and, for a 1.5 bit converter stage, takes on values +1, 0 and −1. Because the capacitors $C_1$ and $C_2$ have the same capacitance, the amplifier's output voltage $v_{out}$ is doubled by the charge transfer and, when D is +1 and −1, is also offset respectively up and down. The proper gained-up residue signal is thereby provided to the succeeding converter stage.

An error component will be inserted in the gained up residue signal if the capacitances of the capacitors $C_1$ and $C_2$ differ, i.e., if they are not matched. An error component will also be inserted if the gain A of the amplifier 40 is not infinite. As indicated in FIG. 1, the voltage at the inverting input of the amplifier is $-v_{out}/A$. This is an error voltage that appears at one plate of the capacitor $C_1$ and corrupts the transfer of electrical charge to the capacitor $C_2$ which, in turn, introduces error into the gained up residue signal. These converter stage errors introduce a nonlinearity into the output digital code $C_{dgtl}$ of the pipelined ADC 20 which cannot be removed by the control and correction logic 37.

Fortunately, current fabrication technologies can sufficiently match the capacitors to achieve conversion accuracies in excess of 12 bits. It is quite difficult, however, to realize a large amplifier gain A at the exceedingly high frequencies (e.g., 1 GHz) required of modern pipelined ADCs. Although various modifications have been proposed to reduce the conversion errors introduced by insufficient differential amplifier gain, they are generally complex and/or add substantial structure and cost to pipelined ADC systems.

BRIEF SUMMARY OF THE INVENTION

The present invention is directed to methods and structures for interleavably processing data signals and error signals in alternating first and second operational phases of successive converter stages of pipelined analog-to-digital converter systems These goals are realized with converter stages that are arranged to interleavably process data signals and error signals in alternating first and second operational phases as they convert input data signals to corresponding digital code.

The interleaved methods and structures significantly reduce conversion errors caused by less-than-infinite and/or nonlinear gain A of converter stage amplifiers and/or samplers. Because this performance enhancement is realized primarily with existing pipelined structure, modification complexity and cost of conventional pipelined systems is substantially reduced. The advantages of the invention are also realized with minimal increase in power consumption and circuit space.

The novel features of the invention are set forth with particularity in the appended claims. The invention will be best understood from the following description when read in conjunction with the accompanying drawings.

BRIEF DESCRIPTION OF THE DRAWINGS

FIGS. 2A and 2B illustrate first and second operational phases for a multiplying digital-to-analog (MDAC) embodiment that modifies the ADC system of FIG. 1;

FIGS. 5A–5D illustrate successive first and second operational phases for another multiplying digital-to-analog (MDAC) embodiment that modifies the ADC system of FIG. 1;

DETAILED DESCRIPTION OF THE INVENTION

The present invention is directed to methods and structures for interleavably processing data and error signals in pipelined ADC systems. This processing significantly reduces ADC nonlinearity and is interleaved to enhance the use of existing pipelined structures and thereby significantly reduce pipeline modifications that would otherwise be required. Interleaving data and error signal processing also reduces the additional power consumption and circuit space that would be required by non-interleaved methods.

Among other significant features of the invention, its error processing methods can be periodically terminated with stored error bits used during the termination periods, it can include randomly-selected capacitors to reduce spurious output signals and its methods and structures improve sampler performance.

Figure 3:
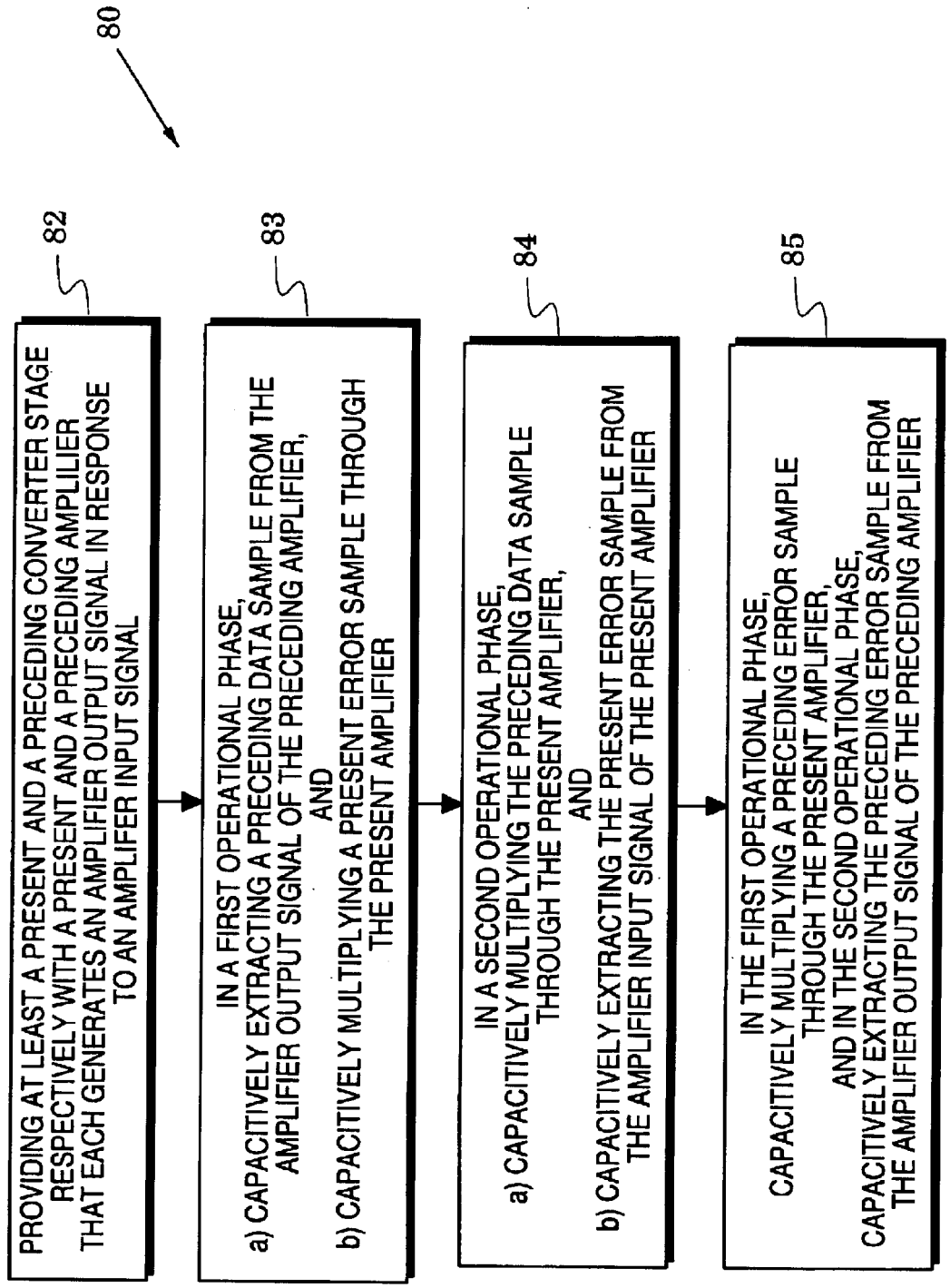
FIG. 3 is a flow diagram that illustrates process steps for interleavably processing data signals and error signals in the MDAC of FIGS. 2A and 2B

Although interleaved processes of the invention are recited in the flow chart of FIG. 3, a description of those processes is facilitated by preceding it with an investigation of MDAC operational phases that are shown in FIGS. 2A and 2B. A description then follows of an MDAC embodiment (shown in FIG. 3) for realizing these operational phases. Subsequently, MDAC operational phases of FIGS. 5A–5D will be investigated and an MDAC embodiment (shown in FIGS. 6A and 6B) for realizing these operational phases is described.

FIGS. 2A and 2B illustrate first and second operational phases in a switched-capacitor MDAC 60 of the present invention. In particular these figures show an MDAC of a present converter stage and portions of MDAC's of preceding and succeeding converter stages (shown in broken lines). The MDAC 60 includes a differential amplifier 62, equal-sized capacitors $C_1$, $C_2$ and $C_3$ and two capacitors $C_4/2$ that each have a capacitance one half that of the capacitors $C_1$, $C_2$ and $C_3$.

Figure 4:
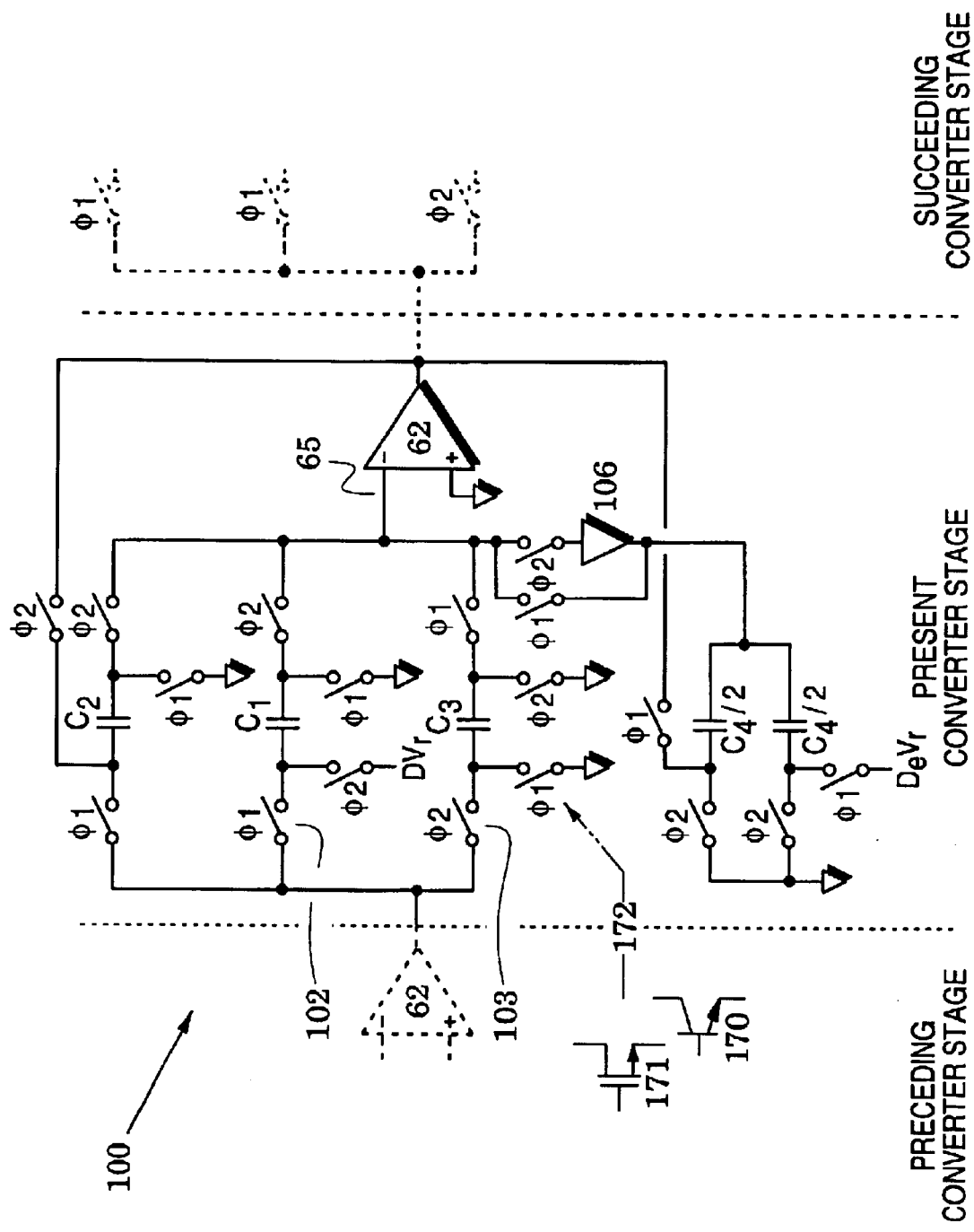
FIG. 4 is a schematic of a multiplying digital-to-analog (MDAC) embodiment that realizes the operational phases of FIGS. 2A and 2B.

Although the MDAC 60 also includes a plurality of switches, FIGS. 2A and 2B illustrate the configuration of the amplifier 62 and the capacitors $C_1$, $C_2$, $C_3$, $C_4/2$ and $C_4/2$ after the switches have been respectively placed in first and second states and, accordingly, the switches themselves are not shown (an MDAC embodiment with switches is shown in FIG. 4 and will be described below). It is noted that the present amplifier 62 of the present converter stage generates an output signal at an output port 66 in response to an input signal at an input port 65 as does also the preceding amplifier 48 that is shown in the preceding converter stage.

In FIG. 2A, the switches (not shown) have been placed in a first state that causes capacitors $C_1$ and $C_2$ to capacitively extract a preceding data sample from the amplifier output signal of the preceding amplifier (i.e., the capacitors are coupled to the amplifier output signal to take on a corresponding electrical charge). In FIG. 2B, the switches (not shown) have been placed in a second state that causes the two capacitors $C_4/2$ to capacitively extract a present error sample from the amplifier input signal of the present amplifier 62. Because the amplifier has an output signal $v_{out}$ and a gain A, an error signal–vout/A exists at its inverting input. The capacitors are coupled to the error signal–vout/A to take on a corresponding electrical charge.

In FIG. 2A, the first state of the switches also couple the two C4/2 capacitors to capacitively multiply the present error sample through the present amplifier 62 by charge transfer that is indicated by a charge-transfer arrow 70. In FIG. 2B, the second state of the switches couples capacitors $C_1$ and $C_2$ to capacitively multiply the present data sample through the present amplifier 62 by charge transfer that is indicated by a charge-transfer arrow 72.

Figure 1:
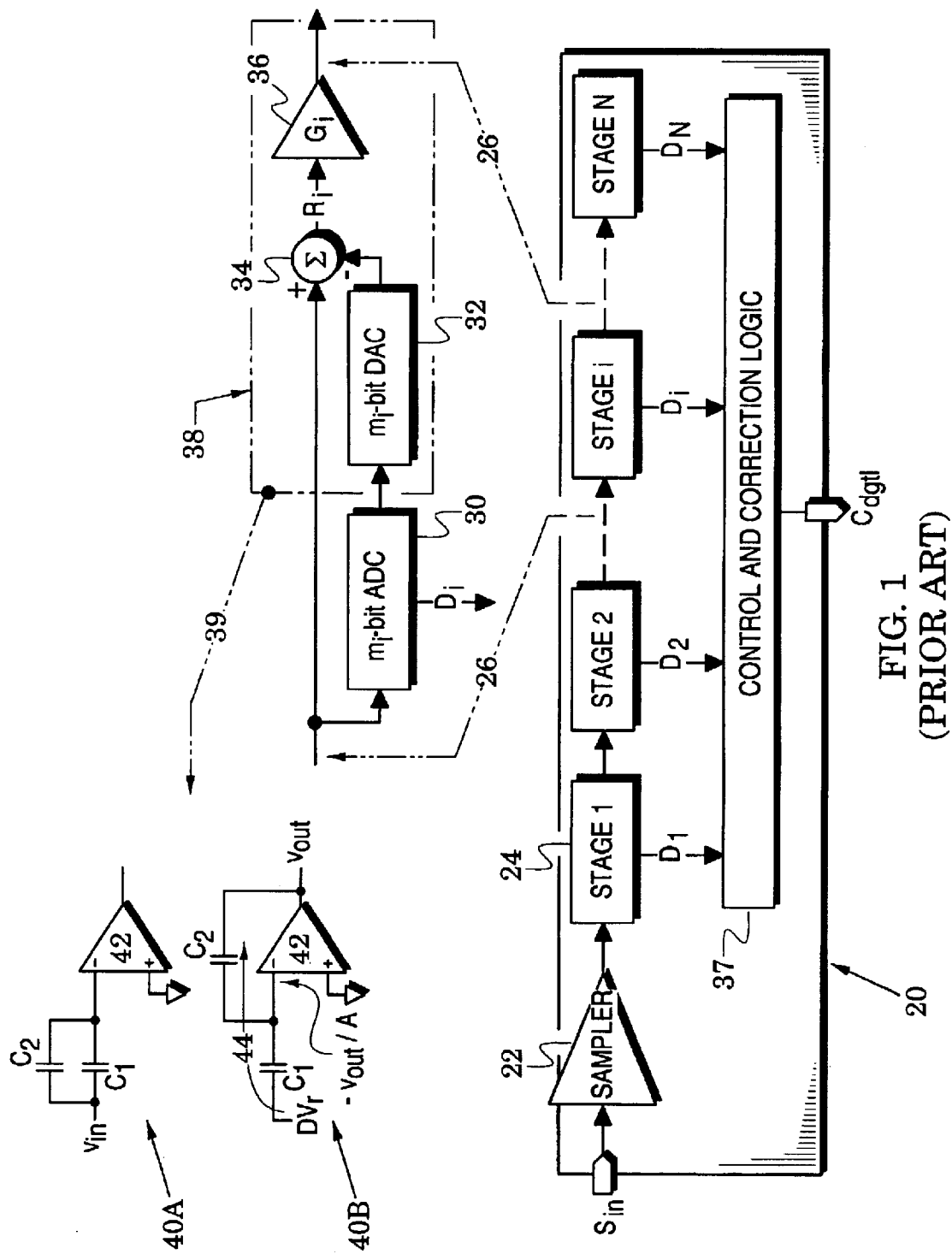
FIG. 1 is a block diagram of a pipelined ADC system.

The present invention recognizes that the gain of the MDAC 40B of FIG. 1 is $$v_{out} = \frac{G}{1+G/A}(v_{in} - DV_r/2) \tag{1}$$

when the decision signal $DV_r$ (introduced in the background section) is applied to capacitor $C_1$ wherein $G=((C_1+C_2)/C_2)$. The gain G is two if capacitors $C_1$ and $C_2$ are well matched and, in that event, $$v_{out}=2v_{in}-DV_r. \tag{2}$$

If the capacitors are matched so there is no error in G and if the amplifier gain A, then the term $G(v_{in}-DV_r/2)$ represents an ideal $v_{out}$. Substitution of ideal $v_{out}$ into equation (1) yields $$v_{out}=\text{ideal } v_{out}-G\ v_{out}/A \tag{3}$$

which identifies an ideal term and an error term $G\ v_{out}/A$ that is generated by the limited amplifier gain A. The error term represents error that is introduced into the processing of data signals because of the limited amplifier gain G. It also represents nonlinearity that is introduced because the amplifier gain G generally changes in response to changes in amplitude of the amplifier's input signal.

The input signal at the amplifier's input port 65 in FIG. 2B thus represents an error signal–vout/A which is the present error sample, that is capacitively extracted by the capacitors $C_4/2$ in the second operational phase of FIG. 2B. Because these capacitors have the same value, they capacitively multiply the present error sample by a factor of two which equals the gain G in the error term of equation (3).

The present converter stage of FIGS. 2A and 2B therefore interleavably processes data signals and error signals in alternating first and second operational phases as it converts input data signals to corresponding digital code. As the capacitors $C_1$ and $C_2$ are capacitively extracting a preceding data signal from the output signal of a preceding converter stage in the first operational phase of FIG. 2A, the amplifier 62 is employed with capacitors $C_4/2$ to capacitively multiply a present error sample to the output port 66 of the present amplifier.

Then, as the capacitors $C_4/2$ are capacitively sampling a present error sample in the second operational phase of FIG. 2B, the amplifier 62 is employed with capacitors $C_1$ and $C_2$ to capacitively multiply the preceding data sample to the output port 66 of the present amplifier. Error samples are thus processed through the amplifier 62 in the first operational phase and data samples are processed through the amplifier 62 in the second operational phase.

This method of interleaved processing is summarized in the process steps that are shown in the flow chart 80 of FIG. 3. In a first process step 82, at least a present and a preceding converter stage are provided that respectively have a present and a preceding amplifier which each generates an amplifier output signal in response to an amplifier input signal.

In a first operational phase of process step 83, a preceding data sample is capacitively extracted from the amplifier output signal of the preceding amplifier and a present error sample is capacitively multiplied through the present amplifier. In a second operational phase of process step 84, a preceding data sample is capacitively multiplied through the present amplifier and the present error sample is capacitively extracted from the amplifier input signal of the present amplifier.

Thus, the preceding data sample and the present error sample are interleavably processed through the present converter stage in the first and second operational phases. Because the amplifier gain A of the preceding converter stage of FIG. 2A is also not infinite, this converter stage also generates an error signal G $v_{out}/A$ at its output port. Preferably, the error history of preceding converter stages is accumulated with the present error signal of the present converter stage for further processing by downstream converter stages.

Accordingly, FIG. 2B also shows that the second state of the switches of the present converter stage couples the capacitor $C_3$ to capacitively extract a preceding error sample G $v_{out}/A$ from the amplifier output signal of the preceding amplifier 62 (note that this preceding amplifier is now in the first state of the present converter stage shown in FIG. 2A). In FIG. 2A, the switches are then placed in a first state that couples capacitor $C_3$ to capacitively multiply the preceding error sample through the present amplifier 62. This occurs by charge transfer (that is indicated by a charge-transfer arrow 74) to the capacitor $C_4/2$ that is coupled about the present amplifier 62.

The preceding amplifier 62 is shown in broken lines in FIGS. 2A and 2B. Because the switches (not shown) of the present converter stage are in their first state in FIG. 2A, the switches of the succeeding converter stage are in their second state in this figure. Accordingly, capacitor $C_3$ of the succeeding converter stage is shown in broken lines coupled to capacitively extract an error sample from the output signal of the present amplifier. Because the switches (not shown) of the present converter stage are in their second state in FIG. 2B, the switches of the succeeding converter stage are in their first state in this figure. Accordingly, capacitors $C_1$ and $C_2$ of the succeeding converter stage are shown in broken lines coupled to capacitively extract a data sample from the output signal of the present amplifier.

The coupling of capacitor $C_3$ is also recited in the flow chart 80 of FIG. 3. In a first operational phase of process step 85, a preceding error sample is capacitively multiplied through the present amplifier. In a second operational phase of process step 85, the preceding error sample is capacitively extracted from the amplifier output signal of the preceding amplifier.

FIG. 4 illustrates an MDAC embodiment 100 that can realize the first and second operational phases of FIGS. 2A and 2B. The MDAC 100 includes the amplifier 62 and the capacitors $C_1$, $C_2$, $C_3$, $C_4/2$ and $C_4/2$ of FIGS. 2A and 2B. In addition, the MDAC 100 shows switches which were not shown in FIGS. 2A and 2B. Portions of the preceding and succeeding converter stages are shown in broken lines.

All of the switches are shown in an open state. A first group of eight switches (including an exemplary switch 102), however, are labeled $\phi 1$ to indicate that they are closed during the first operational phase of FIG. 2A and a second group of nine switches (including an exemplary switch 103) are labeled 02 to indicate that they are closed during the second operational phase of FIG. 2B. It is apparent that the present converter stage 60 of FIG. 2A is realized when the switches labeled $\phi 1$ are closed and the present converter stage 60 of FIG. 2B is realized when the switches labeled $\phi 2$ are closed.

It is recalled that the present error signal–vout/A exists at the amplifier input port 65 in FIG. 2B. Coupling an additional load (e.g., parasitic capacitance) to the input port may corrupt the accuracy of the error signal. Therefore, a buffer amplifier 106 is preferably inserted between the input port 65 and the capacitors $C_4/2$ to reduce disturbance of the error signal (the buffer amplifier 106 is also shown in FIG. 2B).

Because the error signal is typically a very small signal, one method embodiment of interleavably processing data signals and error signals is to accumulate the error in a number of the upstream ones of the converter stages 24 of FIG. 1. Subsequently, the error signal can continue to be accumulated but is then digitized in a number of downstream ones of the converter stages.

When the error is being digitized in downstream converter stages, the capacitive multiplication should be accomplished with a decision signal from each converter stage's ADC (30 in FIG. 1) just as is done when digitizing the data signals. The decision signal $DV_r$ for digitizing data signals is formed with the decision D that each converter stage's ADC makes just prior to the second operational phase of FIG. 2B.

Similarly, a decision signal $D_e V_r$ (subscript e indicating error signal) is formed with the decision $D_e$ that each converter stage's ADC makes just prior to the first operational phase of FIG. 2A. In the downstream converter stages that are digitizing the accumulated error signal, the decision signal $D_e V_r$ is therefore placed on an appropriate one of the capacitors $C_4/2$ in FIG. 2A during the first operational phase. This is indicated in FIG. 2B by a substitution arrow 110 which indicates substitution of the decision signal $D_e V_r$ for the ground signal currently shown at the end of the capacitor $C_4/2$.

If it is desired to stop further error accumulation in the downstream converter stages that are digitizing the accumulated error, this is accomplished by ceasing (in those converter stages) to couple the capacitor $C_3$ to the output signal of the preceding converter stage (as in FIG. 2B) and to the input 65 of the present amplifier (as in FIG. 2A).

Digitization of the error signals is thus realized in the second operational phase of FIG. 2B and interleaved with digitization of the data signals which is realized in the first operational phase of FIG. 2A. For each converter stage that is digitizing error signals, the resulting error bits are added to the signal bits for that stage.

FIGS. 5A–5D illustrate operational phases in another switched-capacitor MDAC embodiment 120 of the present invention. The MDAC 120 includes elements of the MDAC 60 of FIGS. 2A and 2B with like elements indicated by like reference numbers. Capacitor C1, however, now comprises two equal-size capacitors $C_1/2$ and capacitors $C_4/2$ are renamed as capacitors $C_5/2$ to differentiate their function in the MDAC 120 from that of the capacitors $C_4/2$ in the MDAC 60.

In FIG. 5A, switches (not shown) have been placed in a first state that causes capacitors $C_1$ and $C_2$ to capacitively extract a preceding data sample from the amplifier output signal of the preceding amplifier. In FIG. 5B, the switches have been placed in the second state which couples capacitors $C_1$ and $C_2$ to capacitively multiply the present data sample through the present amplifier 62 by charge transfer that is indicated by a charge-transfer arrow 130. In the same operational phase, the switches couple the capacitor $C_3$ to capacitively extract a preceding error sample from the amplifier output signal of the preceding amplifier 62.

Because the data signal is being digitized, the decision signal $DV_r$ (from the present converter stage's ADC) is applied to capacitor $C_1$ in FIG. 5B just as was done in FIG. 2B. The invention notes that the error signal–vout/A is at the input port 65 of the amplifier 62 so that capacitor $C_1$ has a voltage $DV_r + v_{out}/A$ across it in FIG. 5B.

Figure 5C:
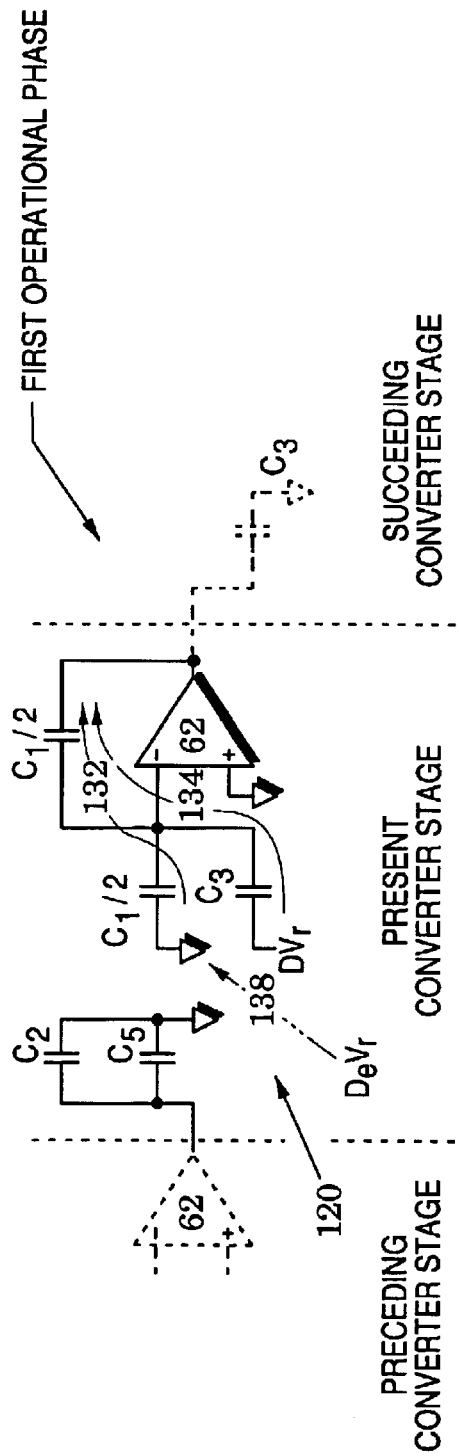

In accordance with the invention, therefore, the capacitor $C_1$ is formed of two equal-sized capacitors $C_1/2$ and in FIG. 5C the switches have been placed in a successive first state (the next first operational state after the first operational state of FIG. 5A) that couples the two $C_1/2$ capacitors to capacitively multiply the present error sample through the present amplifier 62 by charge transfer that is indicated by a charge-transfer arrow 132.

In the same operational phase, the switches couple the capacitor $C_3$ to capacitively multiply the preceding error sample through the present amplifier 62 by charge transfer that is indicated by a charge-transfer arrow 134. The decision signal $DV_r$ is applied to the capacitor $C_3$ to cancel charges corresponding to the voltage $DV_r$ that was applied to the capacitor in FIG. 5B (it is recalled that the capacitance of the capacitor $C_3$ equals that of the two capacitors $C_1/2$). Accordingly, only charges related to the present error sample–vout/A are capacitively multiplied through the present amplifier 62 by the charge-transfer arrow 132.

Because the capacitors $C_1/2$ are now in use in the successive operational phase of FIG. 5C for capacitively multiplying the preceding error sample through the present amplifier 62, they cannot also capacitively extract a preceding data sample from the amplifier output signal of the preceding amplifier. Accordingly, the invention substitutes a capacitor $C_5$ which performs, in the operational phases of FIGS. 5C, 5D and 5A, the functions of the capacitor $C_1$ in the operational phases of FIGS. 5A, 5B and 5C.

Figure 5D:
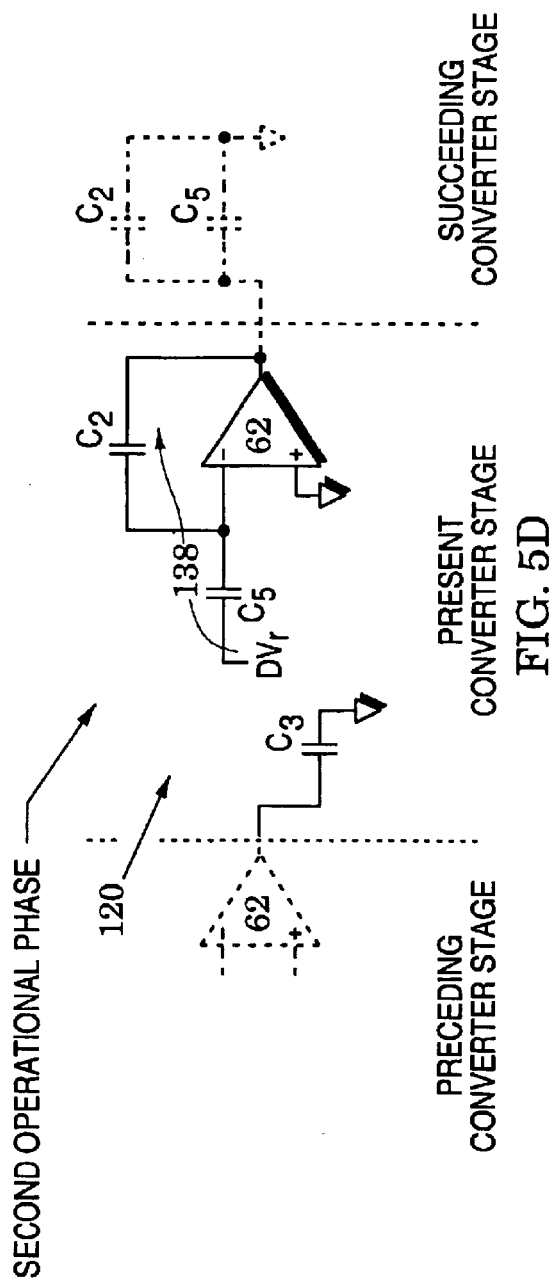

That is, the switches of the MDAC 120 are configured in FIG. 5C in a third state that couples capacitors $C_5$ and $C_2$ to capacitively extract a preceding data sample from the amplifier output signal of the preceding amplifier in FIG. 5C. In FIG. 5D, the switches are placed in a fourth state which couples capacitors $C_5$ and $C_2$ to capacitively multiply the present data sample through the present amplifier 62 by charge transfer that is indicated by a charge-transfer arrow 136. In the same operational phase, the switches couple the capacitor $C_3$ to capacitively extract a preceding error sample from the amplifier output signal of the preceding amplifier 62.

Finally, the capacitor $C_5$ is formed of two equal-sized capacitors $C_5/2$ and in FIG. 5A the switches have been placed in a successive sixth state that causes the two $C_5/2$ capacitors to capacitively multiply the present error sample through the present amplifier 62 by charge transfer that is indicated by the charge-transfer arrow 132 (also shown in FIG. 5C). The switches also couple the capacitor $C_3$ to once again capacitively multiply the preceding error sample through the present amplifier 62 by charge transfer that is indicated by the charge-transfer arrow 134 (also shown in FIG. 5C).

Thus, the capacitors $C_1$ and $C_5$ share responsibilities for capacitively extracting a preceding data sample from the amplifier output signal of the preceding amplifier, capacitively multiplying the preceding data sample through the present amplifier and capacitively multiplying the present error sample through the present amplifier. Data and error signals are therefore interleavably processed through the pipelined converter stages in repeating first and second operational phases with capacitors $C_1$ and $C_5$ successively performing the same operational tasks.

As previously stated, the error signal is typically a very small signal and, accordingly, one method embodiment of interleavably processing data signals and error signals is to accumulate the error in a number of the upstream converter stages and digitize the error with continued error accumulation in a number of downstream converter stages.

When the error is being accumulated in upstream converter stages, the decision signal $DV_r$ is placed on capacitor $C_3$ in the first and third operational phases of FIGS. 5A and 5C to cancel charges (related to the decision signal $DV_r$) that were acquired in the second and fourth operational phases of FIGS. 5D and 5B. When the error is being digitized in downstream converter stages, the ground signals on capacitor $C_5/2$ in the first operational phase of FIG. 5A and on capacitor $C_1/2$ in the third operational phase of FIG. 5C are replaced with the decision signal $D_eV_r$ as was previously done for capacitor $C_4/2$ in the first operational phase of FIG. 2A. Accordingly, a substitution arrow 139 in FIG. 5A indicates substitution of the decision signal $D_eV_r$ for the ground signal currently shown at the end of this capacitor $C_4/2$.

If it is desired to stop further error accumulation in the downstream stages that are digitizing the accumulated error, this is accomplished by ceasing (in those stages) to couple the capacitor $C_3$ to the output signal of the preceding converter stage in FIGS. 5B and 5D and to the input 65 of the present amplifier in FIGS. 5A and 5C.

As stated above, FIGS. 5A–5D illustrate that capacitors $C_1$ and $C_5$ share responsibilities for capacitively extracting a preceding data sample from the amplifier output signal of the preceding amplifier, capacitively multiplying the preceding data sample through the present amplifier and capacitively multiplying the present error sample through the present amplifier.

When capacitors $C_1$ and $C_5$ are not perfectly matched, it is noted that this shared responsibility (i.e., repetitive alteration) may generate spurious lines in the output spectrum of the converted digital code. Accordingly, other converter embodiments of the invention add at least one additional capacitor $C_x$ so that capacitors can be repeatably selected (e.g., on a random basis) from the group $C_1$, $C_5$ and $C_x$ to thereby reduce the generated spurious lines. For example, $C_1$ and $C_5$ may be used in some cycles of the processes of FIGS. 5A–5D, $C_1$ and $C_x$ used in other cycles of the processes of FIGS. 5A–5D, and $C_5$ and $C_x$ used in yet other cycles of the processes of FIGS. 5A–5D.

Figure 6A:
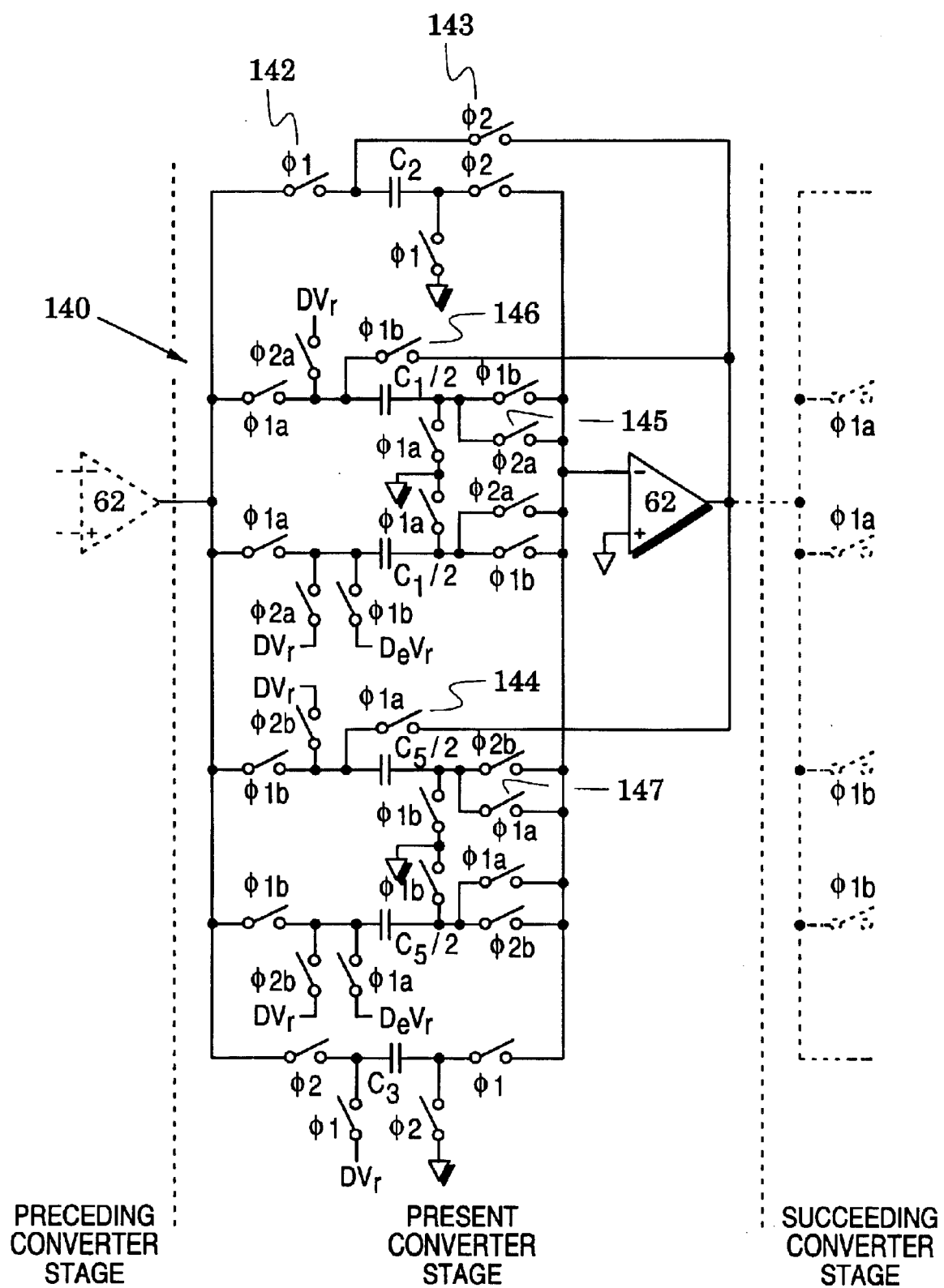
FIG. 6A is a schematic of another multiplying digital-to-analog (MDAC) embodiment that realizes the operational phases of FIGS. 5A–5D.

FIG. 6A illustrates an MDAC embodiment 140 that can realize the successive first and second operational phases of FIGS. 5A–5D. The MDAC 140 includes elements of the MDAC 100 of FIG. 4 with like elements indicated by like reference numbers. The MDAC 140, however, substitutes first and second capacitors $C_1/2$ for capacitor $C_1$ of the MDAC 100 and substitutes first and second capacitors $C_5/2$ for first and second capacitors $C_4/2$ of the MDAC 100. In addition, the MDAC 140 shows switches which were not shown in FIGS. 5A–5D. Portions of the preceding and succeeding converter stages are shown in broken lines.

Figure 6B:
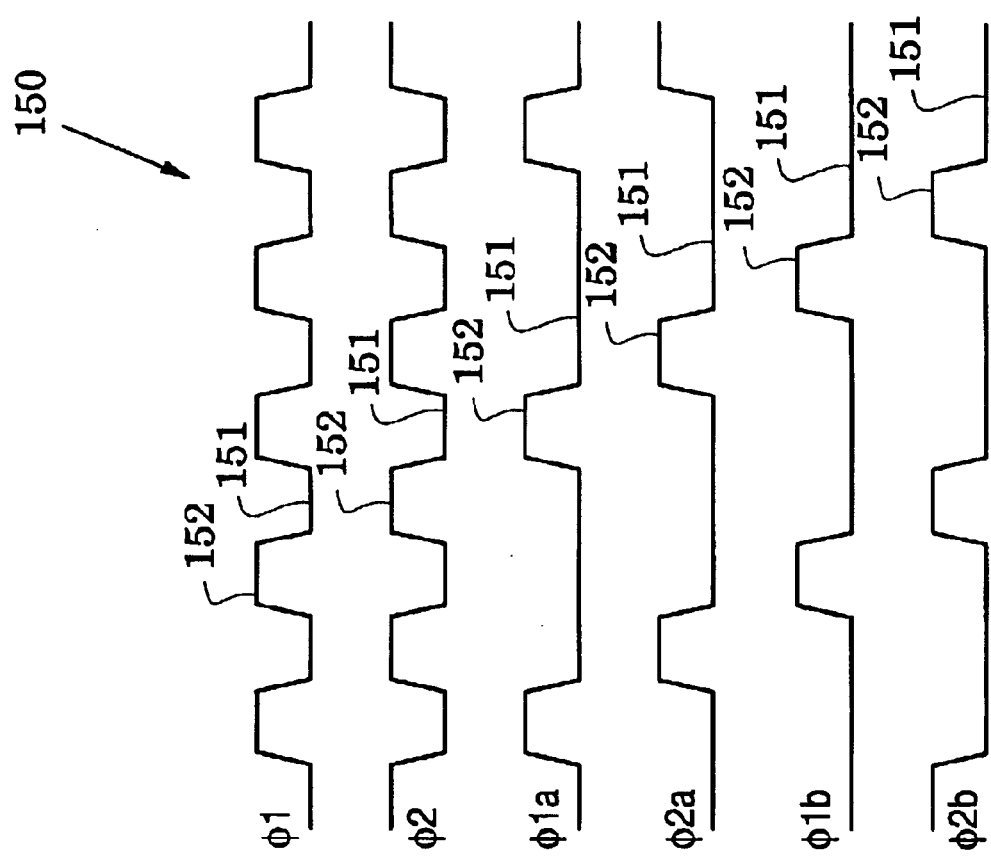
FIG. 6B is a timing diagram that indicates switch states in the schematic of FIG. 6A.

All of the switches are shown in an open state in FIG. 6A wherein the open state corresponds to low states 151 in a corresponding timing diagram 150 of FIG. 6B. A first group of three switches (including an exemplary switch 142), however, are labeled φ1 in FIG. 6A to indicate that they are closed during the first operational phases of FIGS. 5A and 5C as indicated by high states 152 in the φ1 waveform of FIG. 6B. A second group of three switches (including an exemplary switch 143) are labeled φ2 to indicate that they are closed during the second operational phases of FIGS. 5B and 5D as indicated by high states 152 in the φ2 waveform of FIG. 6B.

In addition, a third group of eight switches (including an exemplary switch 144) are labeled φ1a in FIG. 6A to indicate that they are closed during the first operational phase of FIG. 5A as indicated by high states 152 in the φ1a waveform of FIG. 6B. A fourth group of four switches (including an exemplary switch 145) are labeled φ2a to indicate that they are closed during the second operational phase of FIG. 5B as indicated by high states 152 in the φ2a waveform of FIG. 6B.

Finally, a fifth group of eight switches (including an exemplary switch 146) are labeled φ1b in FIG. 6A to indicate that they are closed during the succeeding first operational phase of FIG. 5C as indicated by high states 152 in the φ1b waveform of FIG. 6B. A sixth group of four switches (including an exemplary switch 147) are labeled φ2b to indicate that they are closed during the succeeding second operational phase of FIG. 5D as indicated by high states 152 in the φ2b waveform of FIG. 6B.

It is apparent that the present converter stage of FIG. 5A is realized when the switches labeled φ1 and φ1a are closed, the present converter stage of FIG. 5B is realized when the switches labeled φ2 and φ2a are closed, the present converter stage of FIG. 5C is realized when the switches labeled φ1 and φ1b are closed and the present converter stage of FIG. 5D is realized when the switches labeled φ2 and φ2b are closed.

Figures 7A, 7B:
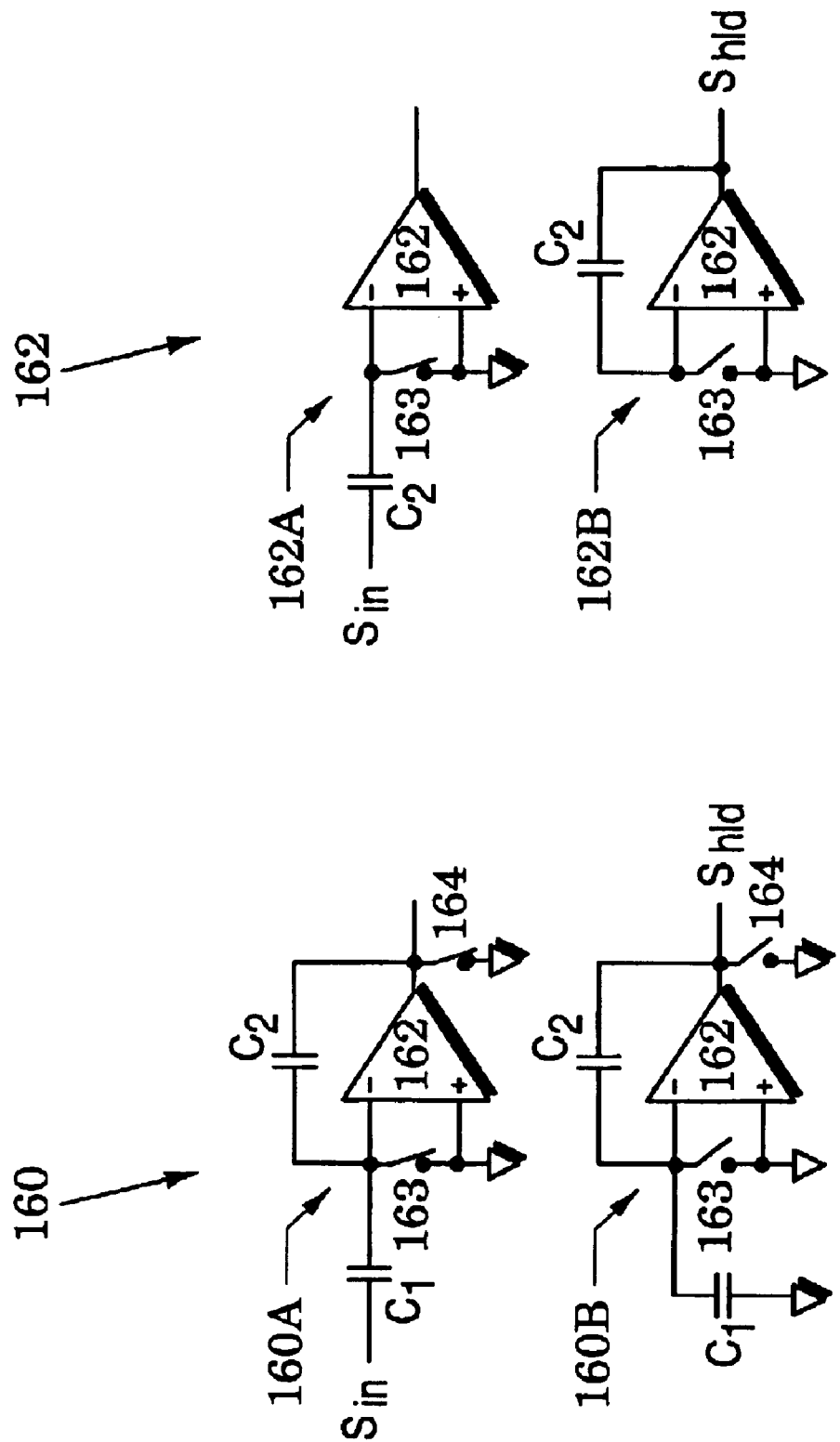
FIGS. 7A and 7B show operational phases for sampler embodiments in the ADC system of FIG. 1.

In addition to the switched-capacitor converter stages 24 of the ADC system 20 of FIG. 1, the interleaved teachings of the invention also apply to switched-capacitor samplers such as the sampler 22 of that system wherein FIGS. 7A and 7B illustrate first and second exemplary sampler structures 160 and 162.

The sampler 160 has a first capacitor $C_1$ coupled to the inverting input of a differential amplifier 162 and a second capacitor $C_2$ coupled between the inverting input and the output port of the amplifier. In a first operational phase 160A of the sampler 160, switches 163 and 164 short the inverting input and the output port to ground. This permits the first capacitor $C_1$ to receive (through its input plate) an electrical charge from the input signal $S_{in}$ and insures there is no electrical charge in the second capacitor $C_2$.

In a second operational phase 160B, the input plate of the first capacitor $C_1$ is grounded and the switches 163 and 164 are opened. This transfers the electrical charge first capacitor $C_1$ from the to the second capacitor $C_2$. The capacitors are generally equal sized so that this charge transfer realizes a signal gain of one. A held signal $S_{hld}$ approximately equal to the input signal $S_{in}$ is thus presented to the succeeding converter stage.

The sampler 162 is similar to the sampler 160 except the first capacitor $C_1$ is the switch 164 are removed. In a first operational phase 162A, one plate of the second capacitor $C_2$ is grounded through the switch 163 and a second plate is coupled to receive an electrical charge from the input signal $S_{in}$.

In a second operational phase 162B, the input plate of the second capacitor $C_2$ is coupled to the output port of the differential amplifier 162 and the switch 163 is opened. The sample of the input signal $S_{in}$ is thus presented as a held signal $S_{hld}$ to a succeeding converter stage. The gain of this sampler is also one.

In the present invention, the sampler 160 can be modified to operate with the processes 82, 83 and 84 of the flow chart 80 of FIG. 3. It can, for example, be modified to operate as shown in FIGS. 2A and 2B or as shown in FIGS. 5A–5D. The sampler 162 is also modified to operate with the processes 82, 83 and 84 of the flow chart 80 of FIG. 3. It can, for example, be modified to operate as shown in FIGS. 5A–5D.

Simulations were run of a 14 bit, 200 megasample per second, pipelined ADC system having 1.5 bit converter stages that have amplifiers (42 in FIG. 1) with a gain A of only 60 dB. The system exhibited a (signal plus noise plus distortion) to (noise plus distortion) ratio (SINAD) of 60 dB and a spurious free dynamic range (SFDR) of 62 dB. Accordingly, this system can only achieve 10 bit resolution of input signals.

The system was altered to contain the interleaved structures of the invention. In particular, error signals were interleavably accumulated in the initial eight converter stages and interleavably digitized in the remaining stages with no further error accumulation. Simulations of this structure showed an enhanced SINAD of 80 dB and an enhanced SFDR of 98 dB so that the interleaved system achieves a full 14 bit resolution of input signals. This advantage was realized with minimal increase in power consumption.

Interleaved MDAC methods and structures have been shown which significantly reduce conversion errors caused by less-than-infinite gain A of MDAC amplifiers. They also reduce nonlinearity caused when amplifier gain G changes with changes in input signal amplitude. This performance enhancement is realized primarily with existing MDAC structure so that modification complexity and cost of pipelined ADC systems is substantially reduced.

Interleaving error and data signal processing also reduces the additional power consumption and circuit space that would otherwise be required. As previously described, error signal digitization is phase-interleaved with digitization of data signals. For each converter stage that is digitizing error signals, the resulting error bits are added to the signal bits for that stage.

Other converter embodiments of the invention further reduce converter power consumption by operating the converter stages in the interleaved methods of the invention during selected operating periods and operating them in conventional methods during the intervening operating periods. In the selected operating periods, the error bits produced by the methods of the invention may be stored (e.g., in the control and correction logic 37 of FIG. 1) as calibration bits and then, in the remaining operational periods, used to correct the output digital code. This intermittent generation and storage of calibration bits further reduces power consumption (e.g., the buffer 106 of FIG. 4 can be turned off) and also permits use of the stage amplifiers (e.g., amplifiers 62 in FIGS. 2A–2B and 5A–5D) to be used for other purposes when they are not processing error samples.

The switches of the invention are generally realized with transistors. In FIG. 4, for example, a bipolar junction transistor 170 or a metal-oxide-semiconductor transistor 171 are substituted for a switch labeled $\phi 1$ as indicated by substitution arrow 172.

Although interleaved converter stage embodiments have been illustrated with 1.5 bit structures, the teachings of the invention generally describe interleaved converter stages that convert to any number of digital bits. The capacitor $C_1$ of FIGS. 2A and 2B, for example, generally becomes multiple capacitors that receive different decision signals for charge transfer.

Although interleaved converter stage embodiments have been illustrated with single-ended structures, the teachings of the invention also embrace differential embodiments.

To simplify the above description, capacitors in different converter stage embodiments have been simply referenced by capacitor numbers, e.g., capacitors $C_1$, $C_2$, $C_3$ and $C_4/2$ in FIGS. 2A and 2B. In claims corresponding to these figures, these capacitor embodiments are referenced by names that best describe their functions. Thus, $C_1$ is a signal-input capacitor, $C_2$ is a signal-transfer capacitor, $C_3$ is an error-input capacitor and the capacitors $C_4/2$ are error-transferring capacitors. Similarly, FIGS. 5A–5D references capacitor embodiments $C_1/2$, $C_2$, $C_3$ and $C_5/2$. In claims corresponding to these figures, the capacitors $C_1/2$ and $C_5/2$ are signal-input capacitors, $C_2$ is a signal-transfer capacitor, and $C_3$ is an error-input capacitor. These names are for referencing purposes only and are not intended to limit the functionality of the capacitors. For example, capacitor $C_2$ in FIGS. 5A and 5B also functions as a signal-input capacitor in addition to functioning as a signal-transfer capacitor.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method for interleavably processing data samples and error samples in alternating first and second operational phases of successive stages of a pipelined analog-to-digital converter system that converts an analog input signal to a corresponding digital code, the method comprising the steps of:

in a first operational phase of at least a present one of said stages,
  a) receiving, from a preceding one of said stages, a data sample that corresponds to said analog input signal; and
  b) processing a present error sample that corresponds to said present stage; and in a successive second operational phase of said present stage,
  a) processing said data sample; and
  b) extracting said present error sample from said present stage;

data samples and error samples thereby interleavably processed through said present converter stage in said first and second operational phases.

2. The method of claim 1, further including the steps of:

in said first operational phase of said present stage, processing a preceding error sample that corresponds to said preceding stage; and in said second operational phase, extracting said preceding error sample from said preceding stage.

3. The method of claim 2, wherein:

said preceding error sample processing step includes the step of capacitively multiplying said preceding error sample through said present stage; and said preceding error sample extracting step includes the step of capacitively extracting said preceding error sample from said preceding stage.

4. The method of claim 1, wherein:

said receiving step includes the step of capacitively extracting said data sample from said preceding stage;

said present error sample processing step includes the step of capacitively multiplying said present error sample through said present stage;

said data sample processing step includes the step of capacitively multiplying said data sample through said present stage; and said extracting step includes the step of capacitively extracting said present error sample from said present stage.

5. The method of claim 1, wherein said present stage and said preceding stage are converter stages that each provides a portion of said digital code.

6. The method of claim 1, wherein said present stage is a converter stage that provides a portion of said digital code and said preceding stage is a sampler that extracts said data sample from said analog input signal.

7. The method of claim 1, further including the steps of:

digitizing said error signals into error bits;

storing said error bits;

periodically terminating said present error processing step and said extracting step; and during said terminating step, correcting said digital code with said error bits.

8. A method for interleavably processing data signals and error signals in alternating first and second operational phases of successive stages of a pipelined analog-to-digital converter system that converts an analog input signal to a corresponding digital code, the method comprising the steps of:

providing at least a present and a preceding stage respectively with a present and a preceding amplifier that each generates an amplifier output signal in response to an amplifier input signal;

in said first operational phase,
  a) capacitively extracting a preceding data sample from the amplifier output signal of said preceding amplifier; and
  b) capacitively multiplying a present error sample through said present amplifier; and in said second operational phase,
  a) capacitively multiplying said preceding data sample through said present amplifier; and
  b) capacitively extracting said present error sample from the amplifier input signal of said present amplifier;

said preceding data sample and said present error sample thereby interleavably processed through said present stage in said first and second operational phases.

9. The method of claim 8, further including the steps of:

in said first operational phase, capacitively multiplying a preceding error sample through said present amplifier; and in said second operational phase, capacitively extracting said preceding error sample from the amplifier output signal of said preceding amplifier.

10. The method of claim 9, further including the step of performing said preceding error sample multiplying step and said preceding error sample extracting step with a capacitor that is coupled to at least partially provide the amplifier input signal of said present amplifier in said first operational phase and coupled to receive the amplifier output signal of said preceding amplifier in said second operational phase.

11. The method of claim 8, further including the step of performing said preceding data sample extracting step and said preceding data sample multiplying step with first and second capacitors that are coupled to receive the amplifier output signal of said preceding amplifier in said first operational phase and respectively coupled to at least partially provide the amplifier input signal of said present amplifier and coupled about said present amplifier in said second operational phase.

12. The method of claim 8, further including the step of performing said present error sample multiplying step and said present error sample extracting step with first and second capacitors that are respectively coupled to at least partially provide the amplifier input signal of said present amplifier and coupled about said present amplifier in said first operational phase and are both coupled to receive the amplifier input signal of said present amplifier in said second operational phase.

13. The method of claim 8, further including the steps of:
performing said preceding data sample extracting step and said preceding data sample multiplying step with first, second and third capacitors that are coupled to receive the amplifier output signal of said preceding amplifier in said first operational phase and with said first and second capacitors respectively coupled to at least partially provide the amplifier input signal of said present amplifier and coupled about said present amplifier in said second operational phase; and
performing said present error sample multiplying step with said first and second capacitors respectively coupled to at least partially provide the amplifier input signal of said present amplifier and coupled about said present amplifier in a succeeding first operational phase.

14. The method of claim 8, further including the steps of:
converting the amplifier output signals of said preceding stage to digital signals in said first and second operational phases;
and
in response to said digital signals, providing corresponding charge-transferring voltages to facilitate said error sample capacitively multiplying step and said signal sample capacitively multiplying step.

15. The method of claim 8, wherein said present stage and said preceding stage are converter stages that each provide a portion of said digital code.

16. The method of claim 8, wherein said present stage is a converter stage that provides a portion of said digital code and said preceding stage is a sampler that extracts said preceding data sample from said analog input signal.

17. An analog-to-digital converter system that interleavably processes data signals and error signals in alternating first and second operational phases as it converts an analog input signal to a corresponding digital code, the system comprising:
a pipeline of stages in which at least one of said stages converts a respective analog input signal to corresponding bits of said digital code wherein:
at least a present one and a preceding one of said stages respectively include a present and a preceding amplifier that each generates an amplifier output signal in response to an amplifier input signal; and
at least said present stage includes a plurality of capacitors and a plurality of switches that are arranged with said present amplifier so that said switches can be switched in said first operational phase to a first state that causes said present stage to:
a) capacitively extract a preceding data sample from the amplifier output signal of said preceding amplifier; and
b) capacitively multiply a present error sample through said present amplifier;
and can be switched in said second operational phase to a second state that causes said present stage to:
a) capacitively multiply said preceding data sample through said present amplifier; and
b) capacitively extract said present error sample from the amplifier input signal of said present amplifier;
said preceding data sample and said present error sample thereby interleavably processed through said present stage in said first and second operational phases.

18. The system of claim 17, wherein said capacitors and said switches are further arranged with said present amplifier so that:
when said switches are in said first state, they cause said present stage to capacitively multiply a preceding error sample through said present amplifier; and
when said switches are in said second state, they cause said present stage to capacitively extract said preceding error sample from the amplifier output signal of said preceding amplifier.

19. The system of claim 18, wherein said capacitors includes a capacitor that is coupled to at least partially provide the amplifier input signal of said present amplifier in said first operational phase and coupled to receive the amplifier output signal of said preceding amplifier in said second operational phase to thereby capacitively multiply said preceding error sample and capacitively extract said preceding error sample.

20. The system of claim 17, wherein said capacitors includes first and second capacitors that are coupled in said first state to receive the amplifier output signal of said preceding amplifier and respectively coupled in said second state to at least partially provide the amplifier input signal of said present amplifier and arranged about said present amplifier to thereby extract said preceding data sample and multiply said preceding data sample.

21. The system of claim 17, wherein said capacitors includes first and second capacitors that are respectively coupled in said first state to at least partially provide the amplifier input signal of said present amplifier and arranged about said present amplifier and coupled in said second state to both receive the amplifier input signal of said present amplifier to thereby multiply said present error sample and extract said present error sample.

22. The system of claim 17, wherein: said capacitors includes first, second and third capacitors that are coupled in said first state to receive the amplifier output signal of said preceding amplifier in said first operational phase with said first and second capacitors coupled in said second state to at least partially provide the amplifier input signal of said present amplifier and said third capacitor coupled in said second state about said present amplifier to thereby extract said preceding data sample and multiply said preceding data sample;

and wherein said first and second capacitors are respectively coupled in a succeeding first state to at least partially provide the amplifier input signal of said present amplifier and coupled about said present amplifier to thereby multiply said present error sample.

23. The system of claim 17, wherein said present stage and said preceding stage each converts a respective analog input signal to corresponding bits of said digital code.

24. The system of claim 17, wherein said present stage converts a respective analog input signal to corresponding bits of said digital code and said preceding stage provides samples of said analog input signal to said present stage.

25. The system of claim 17, wherein at least said present stage further includes an analog-to-digital converter that converts the amplifier output signals of said preceding stage to digital signals in said first and second operational phases; and provides corresponding charge-transferring voltages to facilitate the capacitive multiplication of said error sample step and the capacitive multiplication of said signal sample.

26. An analog-to-digital converter system that interleavably processes data signals and error signals in successive operational phases as it converts an analog input signal to a corresponding digital code, the system comprising:
a pipeline of converter stages that each converts a respective analog input signal to corresponding bits of said digital code wherein at least one of said converter stages includes:
an analog-to-digital converter that provides the corresponding bits of it's converter stage in response to a respective analog input signal received from a preceding one of said converter stages;
a switched-capacitor multiplying analog-to-digital converter that responds to the respective analog input signal and the corresponding bits of its converter stage and provides a respective analog signal to a succeeding one of said converter stages and that includes:
a) an amplifier that generates an amplifier output signal in response to an amplifier input signal;
b) at least first, second, third and fourth signal-input capacitors;
c) a signal-transfer capacitor; and
d) an error-input capacitor; and
a plurality of switches arranged so that, in succeeding first, second, third and fourth operational phases:
said signal-transfer capacitor is switchably-coupled to sample said preceding amplifier output signal in said first and third operational phases and be coupled about said amplifier in said second and fourth operational phases;
said first and second signal-input capacitors are switchably-coupled to sample the preceding amplifier output signal of a preceding one of said converter stages in said first operational phase, transfer electrical charge to said signal-transfer capacitor in said second operational phase and position said second signal-input capacitor about said amplifier to receive electrical charge from said first signal-input capacitor in said third operational phase;
said third and fourth signal-input capacitors are switchably-coupled to sample the preceding amplifier output signal of a preceding one of said converter stages in said third operational phase, transfer electrical charge to said signal-transfer capacitor in said fourth operational phase and position said fourth signal-input capacitor about said amplifier to receive electrical charge from said third signal-input capacitor in said first operational phase; and
said error-input capacitor is switchably-coupled to sample said preceding amplifier output signal in said second and fourth operational phases, transfer electrical charge to said second signal-transfer capacitor in said third operational phase and transfer electrical charge to fourth signal-transfer capacitor in said first operational phase;
said preceding amplifier output signals and the amplifier input signal of said amplifier thereby interleavably processed through said amplifier in said first and second operational phases.

27. The system of claim 26, wherein said signal-transfer capacitor has a signal-transfer capacitance and each of said first, second, third and fourth signal-input capacitors have a signal-input capacitance that is substantially one half of said signal-transfer capacitance.

28. The system of claim 26, wherein said analog-to-digital converter responds to the amplifier input signals of said amplifier and is configured to provide corresponding charge-transferring voltages to said first error-transfer capacitor in said first phase and to said signal-input capacitor in said second phase.

29. The system of claim 26, wherein each of said switches comprises a transistor.

30. The system of claim 26, further including a set of at least five signal-input capacitors and wherein said first, second, third and fourth signal-input capacitors are repeatably selected from said set in successive occurrences of said first, second, third and fourth operational phases to thereby reduce spurious signals in said digital code.

31. The system of claim 30, wherein said first, second, third and fourth signal-input capacitors are randomly selected.

32. An analog-to-digital converter system that interleavably processes data signals and error signals in successive operational phases as it converts an analog input signal to a corresponding digital code, the system comprising:
a pipeline of converter stages that each converts a respective analog input signal to corresponding bits of said digital code and that includes at least a present converter stage and a preceding converter stage wherein said present converter stage includes:
a present analog-to-digital converter that provides present corresponding bits of said present converter stage in response to a present analog input signal received from said preceding converter stage;
a switched-capacitor network that responds to said present analog input signal and said present corresponding bits and provides a succeeding analog input signal to a succeeding one of said converter stages and that includes:
a) an amplifier that generates an amplifier output signal in response to an amplifier input signal;
b) at least one signal-input capacitor;
c) a signal-transfer capacitor;
d) an error-input capacitor; and
e) first and second error-transfer capacitors; and
a plurality of switches arranged so that, in succeeding first and second operational phases:
said signal-transfer capacitor is switchably-coupled to extract a data sample from the amplifier output signal of said preceding in said first operational phase and to coupled about said amplifier in said second operational phase;

said signal-input capacitor is switchably-coupled to sample the preceding amplifier output signal of a preceding one of said converter stages in said first operational phase and to transfer electrical charge to said signal-transfer capacitor in said second operational phase;

said first and second error-transfer capacitors are switchably-coupled to sample the amplifier input signal of said amplifier in said second operational phase and to couple said second error-transfer capacitor about said amplifier to receive electrical charge from said first error-transfer capacitor in said first operational phase; and said error-input capacitor is switchably-coupled to sample said preceding amplifier output signal in said second operational phase and to transfer electrical charge to said second error-transfer capacitor in said first operational phase;

said preceding amplifier output signal and the amplifier input signal of said amplifier thereby interleavably processed through said amplifier in said first and second operational phases.

33. The system of claim 32, further including a buffer amplifier that is switchably inserted between said amplifier and said first and second error-transfer capacitors in said second operational phase.

34. The system of claim 32, wherein said analog-to-digital converter responds to the amplifier input signals of said amplifier and is configured to provide corresponding charge-transferring voltages to said first error-transfer capacitor in said first phase and to said signal-input capacitor in said second phase.

35. The system of claim 32, wherein each of said switches comprises a transistor.

36. The system of claim 27, wherein said signal-transfer capacitor has a signal-transfer capacitance and each of said first and second error-transfer capacitors have an error-transfer capacitance that is substantially one half of said signal-transfer capacitance.

37. A sampler that samples an analog input signal and interleavably processes data signals and error signals in alternating operational phases, comprising:

an amplifier that generates an amplifier output signal in response to an amplifier input signal; and a plurality of capacitors and a plurality of switches that are arranged with said amplifier so that said switches can be switched in a first operational phase to a first state that causes said sampler to:
a) capacitively extract a data sample from said analog input signal; and
b) capacitively multiply an error sample through said amplifier to form said amplifier output signal;

and can be switched in a second operational phase to a second state that causes said sampler to:
a) capacitively multiply said data sample through said sampler to form said amplifier output signal; and
b) capacitively extract said error sample from said amplifier input signal;

said data sample and said error sample thereby interleavably processed through said sampler in said first and second operational phases.

38. The sampler of claim 37, wherein said capacitors include:
a) a signal-transfer capacitor; and
b) first and second error-transfer capacitors; and said switches are arranged so that:
    said signal-transfer capacitor is switchably-coupled to extract said data sample in said first operational phase and coupled about said amplifier in said second operational phase; and
    said first and second error-transfer capacitors are switchably-coupled to said amplifier input signal in said second operational phase and to couple said second error-transfer capacitor about said amplifier to receive electrical charge from said first error-transfer capacitor in said first operational phase.

39. The sampler of claim 38, further including a signal-input capacitor and wherein said switches are arranged so that said signal-input capacitor is switchably-coupled to extract said data sample in said first operational phase and to transfer electrical charge to said signal-transfer capacitor in said second operational phase.

40. The sampler of claim 37, wherein said capacitors include:
a) a signal-transfer capacitor; and
b) first, second, third and fourth error-transfer capacitors; and
said switches are arranged so that:
    said signal-transfer capacitor is switchably-coupled to said analog input signal in first and third operational phases and be coupled about said amplifier in second and fourth operational phases;
    said first and second signal-input capacitors are switchably-coupled to said analog input signal in said first operational phase, transfer electrical charge to said signal-transfer capacitor in said second operational phase and position said second signal-input capacitor about said amplifier to receive electrical charge from said first signal-input capacitor in said third operational phase; and
    said third and fourth signal-input capacitors are switchably-coupled to said analog input signal in said third operational phase, transfer electrical charge to said signal-transfer capacitor in said fourth operational phase and position said second signal-input capacitor about said amplifier to receive electrical charge from said third signal-input capacitor in said first operational phase.

* * * * *

UNITED STATES PATENT AND TRADEMARK OFFICE
CERTIFICATE OF CORRECTION

PATENT NO.           : 6,756,929 B1                                              Page 1 of 1
APPLICATION NO. : 10/402277
DATED                  : June 29, 2004
INVENTOR(S)         : Ahmed Mohamed Abdelatty Ali It is certified that error appears in the above-identified patent and that said Letters Patent is hereby corrected as shown below:

Column 4, line 45, replace "the amplifier gain A," with --the amplifier gain is infinite,--

Signed and Sealed this

Fourteenth Day of August, 2007

JON W. DUDAS
*Director of the United States Patent and Trademark Office*